United States Patent
Ohnhaeuser et al.

(10) Patent No.: US 7,944,379 B2
(45) Date of Patent: May 17, 2011

(54) SAR ADC AND METHOD WITH INL COMPENSATION

(75) Inventors: Frank Ohnhaeuser, Stein (DE); Michael Reinhold, Erlangen (DE)

(73) Assignee: Texas Instruments Deutschland GmbH, Freising (DE)

( * ) Notice: Subject to any disclaimer, the term of this patent is extended or adjusted under 35 U.S.C. 154(b) by 0 days.

(21) Appl. No.: 12/692,763

(22) Filed: Jan. 25, 2010

(65) Prior Publication Data

US 2010/0207791 A1  Aug. 19, 2010

(30) Foreign Application Priority Data

Jan. 23, 2009  (DE) .................. 10 2009 005 770

(51) Int. Cl.
*H03M 1/06*  (2006.01)
(52) U.S. Cl. ........................ 341/118; 341/172
(58) Field of Classification Search ........... 341/118–172
See application file for complete search history.

(56) References Cited

U.S. PATENT DOCUMENTS

| | | | |
|---|---|---|---|
| 4,999,633 A | | 3/1991 | Draxelmayr |
| 5,638,072 A | * | 6/1997 | Van Auken et al. ........... 341/141 |
| 6,124,818 A | * | 9/2000 | Thomas et al. ............... 341/155 |
| 6,246,351 B1 | | 6/2001 | Yilmaz |
| 6,400,302 B1 | * | 6/2002 | Amazeen et al. ............. 341/172 |
| 6,747,589 B2 | * | 6/2004 | Srinivasan et al. ............ 341/172 |
| 6,922,165 B2 | * | 7/2005 | Seymour ....................... 341/172 |
| 7,061,412 B1 | * | 6/2006 | Wang et al. ................... 341/118 |
| 7,265,708 B2 | * | 9/2007 | Mitra et al. ................... 341/172 |
| 2008/0186214 A1 | | 8/2008 | Janakiraman |

* cited by examiner

*Primary Examiner* — Lam T Mai
(74) *Attorney, Agent, or Firm* — John J. Patti; Wade J. Brady, III; Frederick J. Telecky, Jr.

(57) ABSTRACT

An apparatus for analog-to-digital conversion using successive approximation is provided. There is a successive approximation register or SAR controller for providing a digital code representing a conversion result, and an integral non-linearity (INL) compensator configured to provide an INL compensation signal for reducing INL of the analog-to-digital conversion in response to the digital code.

7 Claims, 5 Drawing Sheets

SAR ADC AND METHOD WITH INL COMPENSATION

CROSS-REFERENCE TO RELATED APPLICATIONS

This application claims priority from German Patent Application No. 102009005770.6, filed Jan. 23, 2009, which is hereby incorporated by reference for all purposes.

FIELD OF INVENTION

The invention relates to successive approximation register (SAR) ADCs and methods for operating SAR ADCs.

BACKGROUND

There is an ever increasing demand for better analog-to-digital converters. Important characteristics of SAR analog-to-digital converters (SAR ADCs) are the differential non-linearity (DNL) and the integral non-linearity (INL). If a capacitive digital-to-analog converter is used in the SAR ADC, the capacitor mismatch causes DNL. In order to reduce DNL, ADCs are trimmed. There are several different sources for INL. One of the most relevant sources is the voltage coefficient of the sampling capacitor. Other sources are digital noise or noise of reference or supply voltages. However, there are no solutions for reducing the INL.

SUMMARY

It is an object of the invention to provide an ADC and methods for operating ADCs with reduced integral non-linearity.

Accordingly, an apparatus for analog-to-digital conversion using successive approximation is provided. The apparatus includes a successive approximation register (SAR) controller for providing a digital code representing a conversion result. Furthermore, there is an integral non-linearity (INL) compensator configured to provide an INL compensation signal for reducing an integral non-linearity of the analog-to-digital conversion in response to the digital code. The INL compensation procedure in the INL compensator is based on the digital code of the analog-to-digital conversion. Therefore, a corresponding INL error of the apparatus can be continuously reduced, i.e., it can be kept small, during conversion. The conversion result is a final or intermediate result of the analog-to-digital conversion (i.e., for example the running output code continuously approximating the final digital output word).

The INL compensation signal may advantageously be an analog signal. Feeding an analog compensation signal to the apparatus for compensating an INL error allows INL compensation steps to be smaller than an LSB of an ADC. The magnitude of the compensation signal may advantageously be smaller than an LSB of the SAR ADC. This improves the DNL (differential non-linearity) of the device.

The apparatus, i.e., the analog-to-digital converter in the apparatus may be a capacitive SAR ADC. The apparatus may include a first plurality of capacitors which are used as a capacitive digital-to-analog converter (CDAC). The CDAC may then include one or more additional compensation capacitors, which are/is coupled to receive the INL compensation signal during conversion. The one or more additional capacitor may be arranged on the negative side of the CDAC or the positive side of the CDAC or on both sides. This depends on whether a single ended or fully differential implementation is used. Applying the compensation signal through the additional compensation capacitors provides a very efficient way of compensation and supports matching of the capacitors.

The INL compensator may be coupled to the SAR controller. The INL compensator may then be configured to use a code of the running analog-to-digital conversion for generating the compensation signal. This provides continuous or stepwise reduction of the INL error within the analog-to-digital conversion procedure.

The INL compensator may be adapted to provide a linear approximation (i.e., piecewise linear approximation) of an INL error of the SAR ADC. The INL compensator may then provide a compensation signal that represents the (piecewise) linear approximation of the INL error. This INL compensation signal may then be added or subtracted in the CDAC (for example using the compensation capacitors) so as to compensate the INL error. Using a linear approximation instead of the exact value of the INL error simplifies the compensation procedure and the compensation signal generation circuits.

The apparatus (or the INL compensator of the apparatus) may further comprise an INL digital-to-analog converter (DAC) which provides at an output the compensation signal. Using a DAC is possible if the INL error is a fixed function of the input signal of the SAR ADC. This is typically the case for capacitive SAR ADCs, where the capacitors have voltage coefficients. In this situation, the INL is mainly a result of the non-linear behavior of the capacitors. Therefore, the invention can advantageously be applied to capacitive SAR ADCs for compensating an error that is due to the non-linear behavior of the capacitors.

The INL DAC may comprise a couple of switches. These switches may be directly driven by the digital code received from the SAR controller. This is a very efficient way of generating a compensation signal. The INL DAC may be a resistive string digital-to-analog converter. The INL function (i.e., the relationship between the compensation signal and the digital code from the SAR controller) may then be implemented through analog circuit or through a digital decoder. An analog implementation is possible, as the resistors used in the resistive string digital-to-analog converter can be adapted to implement a specific input/output function. Furthermore, the resistors may have values to implement a rather linear function and a specific input/output behavior may be achieved through a digital implementation. This makes it possible to adapt the input/output function with only a few masks during a manufacturing process of an integrated circuit.

The INL compensator may include a reference signal generator. The reference signal generator may be configured to provide a reference signal which is a function of the reference voltage, for example a function of the reference voltage to the power of three (REF^3). This is particularly useful as the INL can be a function of the reference voltage, in particular a function of the reference voltage to the power of three (reference voltage cubed). The reference signal provided by the reference signal generator may then be fed to the INL DAC so as to provide a compensation signal that is a function of the reference voltage, in particular a function of the reference voltage to the power of three.

The apparatus may further comprise an interpolating amplifier, which is coupled between the CDAC and the INL DAC. This interpolating amplifier may be adapted to interpolate an INL DAC output signal. The compensation signal may then be provided at an output of the interpolating amplifier. This helps to reduce the number of components needed in the INL DAC. If the DAC is, for example implemented as a resistive string digital-to-analog converter, the number of resistors can be reduced. An embodiment of an interpolating amplifier that can be used is described in U.S. Pat. No. 6,246, 351 B1.

The invention also provides a method for analog-to-digital conversion using successive approximation. Accordingly, an INL compensation signal can be determined based on a digital code of a running analog-to-digital conversion. This INL compensation signal may then be used to reduce an INL of the analog-to-digital conversion. The INL compensation signal may advantageously be an analog signal. Further method steps may be derived from the above aspects of the invention.

Furthermore, the method and the device may be configured to perform a dynamic error correction during conversion. An embodiment of such a dynamic error correction is described in U.S. Pat. No. 6,747,589 B2. In a dynamic error correction step, a bit decision is checked as to whether or not the quantization error is below a maximum admissible limit. Testing and correction may be performed quasi simultaneously by selectively coupling one or more additional correction capacitors (e.g. of the same size as the capacitor of the tested bit) to the comparator input. The two additional correction capacitors can be switched between the reference voltages in order to add or subtract a voltage representing a certain amount of LSBs. The dynamic error correction provides that the successive approximation process converges.

BRIEF DESCRIPTION OF DRAWINGS

For a more complete understanding of the invention, and the advantages thereof, reference is now made to the following descriptions taken in conjunction with the accompanying drawings, in which.

DETAILED DESCRIPTION

Figure 1:
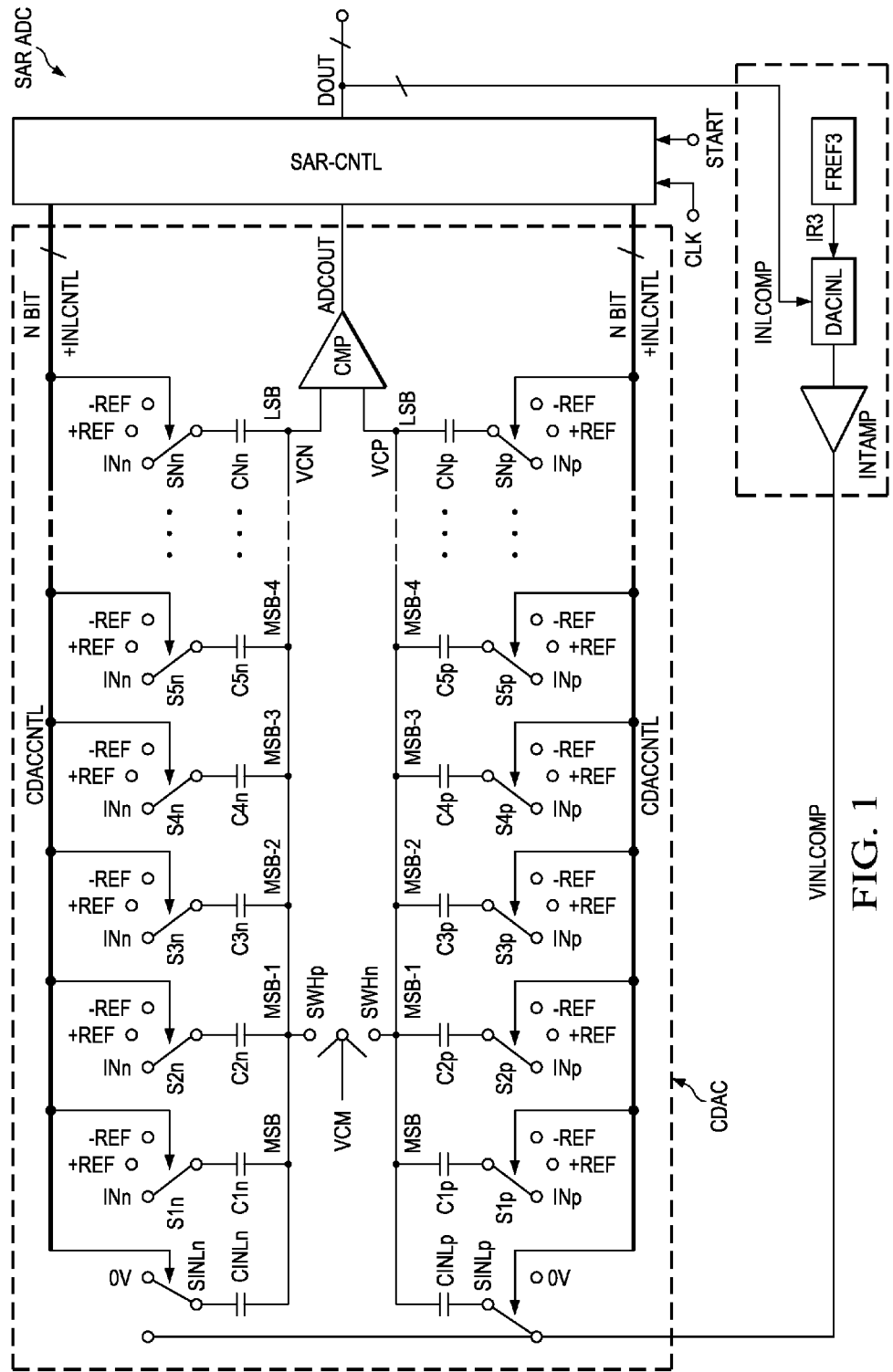
FIG. 1 is a simplified circuit diagram of an embodiment of an apparatus according to the invention.

FIG. 1 shows a simplified block and circuit diagram of an apparatus for analog-to-digital conversion using successive approximation according to aspects of the invention. The general functionality and operation of successive approximation register digital converters SAR ADC is well known in the art. SAR ADCs compare the analog input voltage to reference voltage levels, which can be generated by a digital-to-analog converter (DAC). The embodiment shown in FIG. 1 uses a capacitive digital-to-analog converter CDAC. The CDAC has a positive side with capacitors C1p-CNp and a negative side with capacitors C1n-CNn. The capacitors C1p and C1n are adapted to evaluate the most significant bit (MSB) and the capacitors CNp and CNn are adapted to evaluate the least significant bit (LSB). The common nodes VCP and VCN of each of the capacitors C1p-CNp and C1n-CNn can be coupled to a common mode voltage VCM by sample and hold switches SWHp, SWHn. The other side of each of the capacitors C1p-CNp and C1n-CNn can be coupled to a positive reference voltage +REF, a negative reference voltage −REF or a symmetric input voltage INp, INn.

The analog input voltage can be sampled directly on one or more of the capacitors C1p-CNp and C1n-CNn by closing the switches SWHn, SWHp (i.e., the switches are conducting) and coupling INp and INn to the other side of some or all capacitors, such that a charge corresponding to the size of the capacitors and proportional to the amplitude of the input voltage is present on the sampling capacitors. The sampled charge is frozen by opening the switches SWHn, SWHp and redistributed stepwise among the capacitors of the CDAC. The magnitude of the input voltage is basically determined by selectively and consecutively switching the other sides of the capacitors between the different reference voltage levels +REF and −REF and comparing the established voltage level on the common nodes VCP, VCN.

The switching of the other side of each of the plurality of capacitors is performed through numerous switches S1n-SNn, S1p-SNp, which are controlled by control signals CDACCNTL provided by controller SAR-CNTL in response to the comparator output ADCOUT at each step of the conversion process. The capacitors having the largest capacitance C1p, C1n can be the first to be connected to a specific reference voltage level (not necessarily the same), while the remaining capacitors C2p-CNp, C2n-CNn are connected to another reference voltage level. Then the voltage on the common nodes VCP, VCN, which are connected to respective positive and negative inputs of a comparator CMP, is compared, and the output ADCOUT of the comparator CMP represents the bit values of the digital output word DOUT bit by bit, starting with the most significant bit (MSB). In accordance with the signal at the output ADCOUT of the comparator CMP (i.e., the comparison result), the capacitors C1p-CNp and C1n-CNn are consecutively connected one-by-one to either the first or the second reference voltage level +REF or −REF and remain in the position during the subsequent conversion steps. The intermediate results are stored in a register (successive approximation register) which resides together with other logic for controlling the analog-to-digital conversion process in a controller referred to as successive approximation register controller SAR-CNTL. The controller SAR-CNTL may have an input for receiving a clock signal CLK and an input for receiving a start signal START which indicates that conversion is to be started. The controller SAR-CNTL provides the digital output word which represents the digital value of the sampled input voltage at output node DOUT.

The SAR controller SAR-CNTL provides control signals for the CDAC and the INL compensator INLCOMP which is coupled between the SAR controller SAR-CNTL and the capacitive digital-to-analog converter CDAC.

The INL compensator INLCOMP provides a compensation signal VINLCOMP to capacitive digital-to-analog converter CDAC. The compensation signal VINLCOMP is fed to the CDAC through compensation capacitors CINLn, CINLp and corresponding switches SINLn, SINLp. The compensation capacitors CINLn, CINLp can be switched either to a reference voltage (+REF, −REF, GND, 0 V or any other fixed potential etc.) or to VINLCOMP for compensating an INL error voltage. The compensation signal VINLCOMP can be derived from digital output code DOUT (running code, intermediate conversion result) of the SAR controller SAR-CNTL. DOUT not only represents the final result but provides the running code during conversion, i.e., all intermediate results during successive approximation. Therefore, the INL error voltage can be compensated during the running conversion (e.g. several times). Very small compensation steps may be used which may be smaller than an LSB. The bus width of control signals. CDACCNTL may be N+1 on each side for the switches of the CDAC including switches SINLn, SINLp for the INL correction capacitors CINLn, CINLp. The control signals for the INL correction capacitors CINLn, CINLp may also be generated in INL compensator INLCOMP.

The INL compensator INLCOMP may include an INL digital-to-analog converter DACINL. Furthermore, there may be a reference signal generator FREF3 and also optionally an interpolation amplifier INTAMP.

In an embodiment, charge is stored on the sampling capacitor, which should be linear to the input voltage $Q_s=C_s \cdot VIN$ during the sampling phase. Due to linear ($VC_1$) and quadratic coefficients ($VC_{qu}$) the sampling charge is $Q_s=C_S \times (1+VC_1 \times VIN+Vc_{qu} \times VIN^2) \times VIN$. The additional and voltage dependent charge generates integral non-linearity.

According to this aspect of the invention, the additional and voltage dependent charge is compensated during conversion. During the conversion steps of the analog-to-digital converter, the digital code in the SAR converts the final digital code representing the input voltage. Therefore, the digital code in the SAR controller may be used for compensating the integral non-linearity. The additional charge $Q_{INL}=C_S \times (VC_1 \times VIN + VC_{qu} \times VIN^2) \times VIN$ and the corresponding error voltage VERR can be compensated.

It is possible to estimate the error in LSB and adjust the error in the digital domain. However, this can only be done in steps of 1 LSB as long as the SAR ADC does not internally convert with a higher resolution. Adjusting in 1 LSB steps generates jumps in the ADC's transfer function and generates significant DNL, errors. Furthermore, it is difficult to adapt to varying reference voltages with this solution.

According to an embodiment of the invention, the error voltage VERR may be compensated in small steps in order to leave the differential non-linearity (DNL) nearly unaffected.

The apparatus as shown in FIG. 1 may be configured as follows. The input voltage may be +/−10 V. The sampling capacitance may be 80 pF. The remaining 10 pF are connected to a negative reference voltage −REF during sampling. If the input voltage is referred to as VIN=a×REF with a from the interval [−1,1], the sampled charge $Q_{samp,p}$ can be calculated to as follows:

$$Q_{samp,p} = a \times 80\,\text{pF} \times REF - 10\,\text{pF} \times F \quad (1)$$

The parameter "a" may typically correspond to the digital output code DOUT, in particular the running code (or intermediate result) of the SAR ADC shown in FIG. 1. During conversion the 10 pF are continuously connected to the positive reference to generate an offset for a valid operating point of the comparator CMP. The 80 pF of the sampling capacitance $C_S$ are switched between the negative reference −REF and the positive reference REF. At the end of the analog-to-digital conversion and at critical code decisions during the conversion, where the differential comparator input is zero, $$\frac{1+a}{2}$$

of the 80 pF are connected to the positive reference and $$\frac{1-a}{2}$$

are connected to the negative reference. The charge distribution $Q_{crit,p}$ can be summarized as follows:

$$Q_{crit,p} = \frac{1+a}{2} \times 80\,\text{pF}(REF - V_{CP}) + \qquad (2)$$
$$\frac{1-a}{2} \times 80\,\text{pF}(-REF - V_{CP}) + 10\,\text{pF}(REF - V_{CP})$$

The charge $Q_{crit,p}$ is preserved and equal to the sampling charge $Q_{samp,p}$ ($Q_{samp,p}=Q_{crit,p}$). This relationship provides that $$V_{CP,crit} = REF \times \frac{20}{90}. \qquad (3)$$

which describes the offset that is generated using the 10 pF capacitor.

The capacitors change their nominal value $C_{nom}$ with the voltage $V_{cap}$ across them. The following equation takes account of this relationship.

$$C=C_{nom}(1+VC_1 \times V_{cap}+VC_{qu} \times V_{cap}^2) \qquad (4)$$

If this relationship is substituted in the equations (1) and (2) for $Q_{samp,p}$ and $Q_{crit,p}$, and considering that $V_{cap}$=a REF, then:

$$Q^*_{samp,p} = 80\,\text{pF}\left(\begin{array}{c} 1+CV_1 \times a \times REF + \\ VC_{qu} \times a^2 \times REF^2 \end{array}\right) \times a \times REF - \qquad (5)$$
$$10\,\text{pF}\left(\begin{array}{c} 1-VC_1 \times REF + \\ VC_{qu} \times REF^2 \end{array}\right) \times REF$$

$$Q^*_{crit,p} = \left[1+VC_1\left(\frac{REF+}{V_{cp}}\right) + VC_{qu}\left(\frac{REF-}{V_{cp}}\right)^2\right]\left[80\,\text{pF}\left(\begin{array}{c}\frac{1+a}{2}\left(\frac{REF-}{V_{cp}}\right) - \\ \frac{1-a}{2}\left(\frac{REF+}{V_{cp}}\right)\end{array}\right) + 10\,\text{pF}(REF - V_{cp})\right] \qquad (6)$$

The charges $Q^*_{samp,p}$ and $Q^*_{crit,p}$ are preserved (frozen) and equal, so that $$0 = -95\,\text{pF} \times V_{cp} + 95\,\text{pF} \times VC_1 \times V_{cp}^2 - 95\,\text{pF} \times VC_{qu} \times V_{cp}^3 + \qquad (7)$$
$$REF \times \left(\begin{array}{c} -80\,\text{pF} \times 2a \times VC_1 \times V_{cp} + \\ 80\,\text{pF} \times 3a \times VC_{qu} \times V_{cp}^2 - \\ 30\,\text{pF} - 15\,\text{pF} \times 2 \times VC_1 \times V_{cp} + \\ 15\,\text{pF} \times 3 \times VC_{qu} \times V_{cp}^2 \end{array}\right) +$$
$$REF^2 \times \left(\begin{array}{c} 80\,\text{pF} \times VC_1 - \\ 80\,\text{pF} \times VC_1 \times a^2 - \\ 95\,\text{pF} \times 3VC_{qu} \times V_{cp} \end{array}\right) + REF^3 \times \left(\begin{array}{c} 80\,\text{pF} \times a \times VC_{qu} - \\ 80\,\text{pF} \times VC_{qu} \times a^3 + \\ 30\,\text{pF} \times VC_{qu} \end{array}\right)$$

Here, it may be assumed that positive and negative sides of the CDAC operate fully differentially. Therefore, the corresponding equation can be set up for the negative side:

$$0 = -95\,\text{pF} \times V_{cn} + 95\,\text{pF} \times VC_1 \times V_{cn}^2 - 95\,\text{pF} \times VC_{qu} \times V_{cn}^3 + \quad (8)$$

$$REF \times \begin{pmatrix} 80\,\text{pF} \times 2a \times VC_1 \times V_{cn} - \\ 80\,\text{pF} \times 3a \times VC_{qu} \times V_{cn}^2 + \\ 30\,\text{pF} - 15\,\text{pF} \times 2 \times VC_1 \times V_{cn} + \\ 15\,\text{pF} \times 3 \times VC_{qu} \times V_{cn}^2 \end{pmatrix} +$$

$$REF^2 \times \begin{pmatrix} 80\,\text{pF} \times VC_1 - \\ 80\,\text{pF} \times VC_1 \times a^2 - \\ 95\,\text{pF} \times 3 \times VC_{qu} \times V_{cn} \end{pmatrix} + REF^3 \times \begin{pmatrix} -80\,\text{pF} \times a \times VC_{qu} + \\ 80\,\text{pF} \times VC_{qu} \times a^3 + \\ 30\,\text{pF} \times VC_{qu} \end{pmatrix}$$

In the equations (8) and (9), terms without an "a" result in an offset error. If this offset is applied to the positive and negative side ($V_{cn}=V_{cp}$ at the critical decision), the error is cancelled by the fully differential architecture of the CDAC. Further more, due to the relationship $V_{cn}=V_{cp}=V_c$, many terms of the two equations are eliminated. The remaining error voltage VERR results is as follows:

$$VERR = REF \times a \times (4 \times VC_1 \times V_c - 6 \times VC_{qu} \times V_c^2) + REF^3 \times (-2a \times VC_{qu} + VC_{qu} \times 2a^3) \quad (9)$$

The first term "REF×a" linearly depends on the input voltage VIN and generates a gain error, which can be neglected. Since any term with an "a" is a linear function of the input voltage VIN, these parts of the equation may only cause insignificant gain errors which are reference dependent. Only the final term in the previous equation with "$a^3$" (i.e., the running digital code to the power of three) significantly contributes to the INL. According to an aspect of the invention, only this term is considered for compensation. The compensation voltage $V_{INL,comp}$ may then be defined as $$V_{INL,comp} = (a \times REF)^3 \times 2VC_{qu} \quad (10)$$

Figure 2:
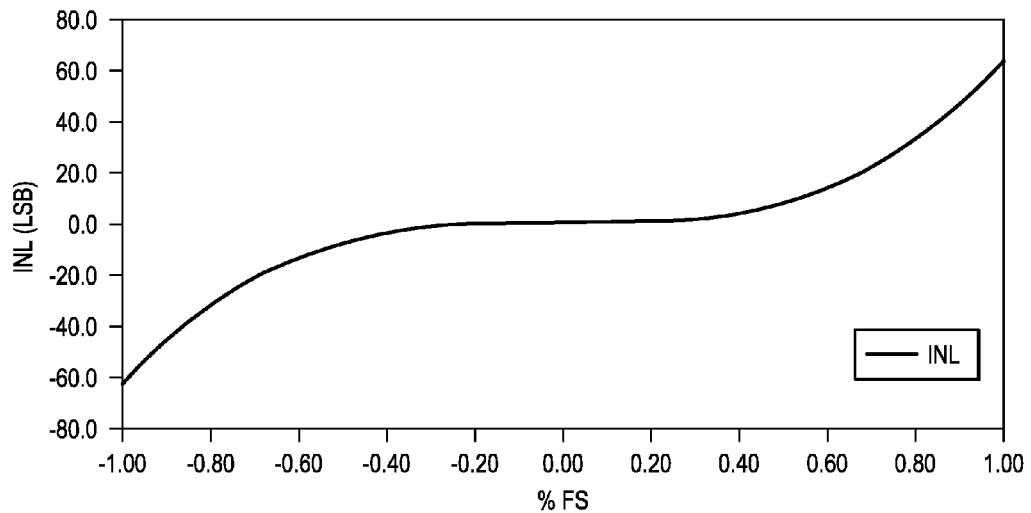
FIG. 2 is a diagram of the required INL compensation signal as a function of the input signal according to an embodiment of the invention.

Parameter "a" can be considered as the intermediate result of the SAR ADC during conversion, i.e., a may the running digital output code of the ADC (i.e., a=code). A corresponding diagram for equation (10) is shown in FIG. 2. The diagram shows the compensation voltage in LSBs for a 20 bit resolution. For a full-scale input signal from −REF to +REF (+/−REF=+/−10 V; VIN=a·REF with "a" lying in the interval [−1,1]) the compensation voltage $V_{INL,comp}$ would then reach from more than −60 LSB to +60 LSB. Equation (10) is difficult to implement. The compensation voltage $V_{INL,comp}$ may have to change significantly at the positive and negative full-scale values. This means that the lower bit decisions have a significant influence to the compensation voltage.

Additionally, dynamic error correction may be performed. A first dynamic error correction step may be applied after bit 7 and a second after bit 15. However, the dynamic error corrections steps usually have only a limited correction range. If a correction step is used after bit 7 and after bit 15, a maximum of 6-8 LSBs may be corrected during the second correction time. This is much less than the 60 LSB shown in FIG. 2.

Therefore, according to an aspect of the invention, it is suggested to compensate according to the following equation.

$$V_{INL,comp} = 2 \times REF^3 \times VC_{qu} \times (a^3 - a) \quad (11)$$

Equation (11) is based on the following considerations. The steepness of the equation (10) is the first derivative of $V_{INL,comp}$ to a:

$$\frac{dV_{INL,comp}}{da} = 6 \times a^2 \times REF^3 \times VC_{qu} \quad (12)$$

$$\left(\frac{dV_{INL,comp}}{da}\right)_{max} = 6 \times REF^3 \times VC_{qu} \quad (13)$$

However, if the correction voltage is limited to:

$$V_{INL,comp} = REF^3(-2a \times VC_{qu} + VC_{qu} \times 2a^3) = 2 \times REF^3 \times VC_{qu} \times (a^3 - a) \quad (14)$$

it can be derived that $$\frac{dV_{INL,comp}}{da} = 2 \times REF^3 \times VC_{qu}(3a^2 - 1) \quad (15)$$

$$\left.\frac{dV_{INL,comp}}{da}\right|_{max} = 4 \times REF^3 \times VC_{qu} \quad (16)$$

Figure 3:
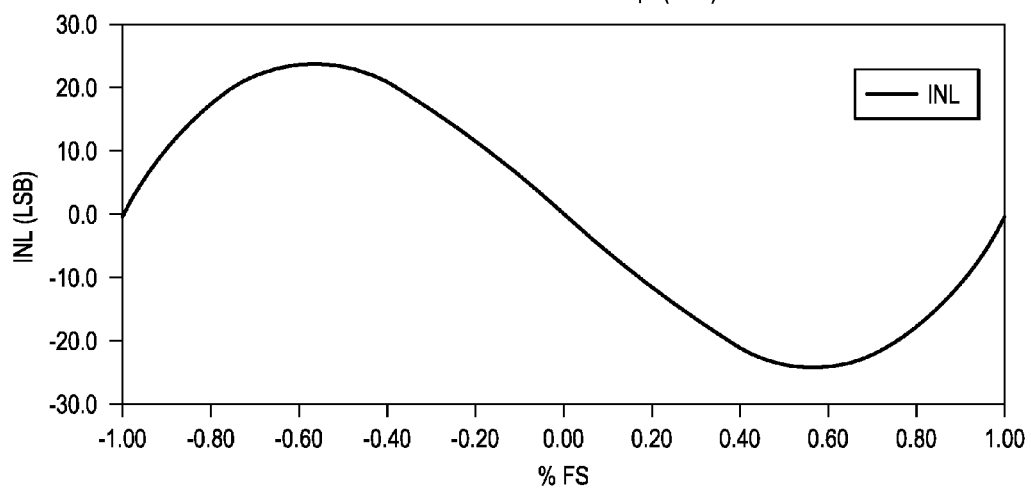
FIG. 3 is a diagram of an optimized INL compensation signal as a function of the input signal according to another embodiment of the invention.

This relationship is shown in FIG. 3. FIG. 3 shows the optimized INL compensation signal in LSBs. The parameter "a" ranges from −1 to +1 corresponding to a full scale input signal from −REF to +REF.

Figure 4:
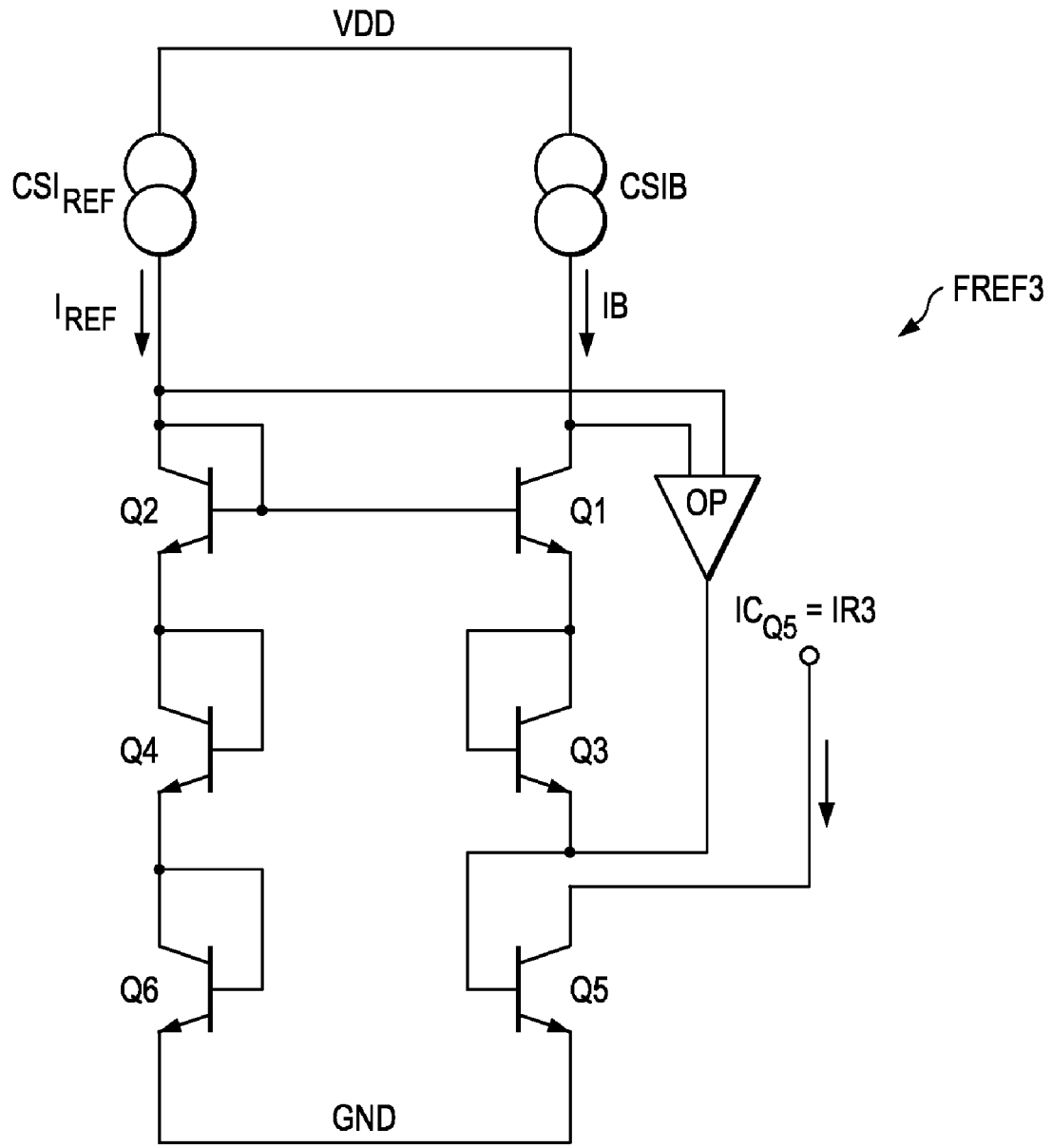
FIG. 4 is a simplified circuit diagram of a reference signal generator according to an embodiment of the invention.

FIG. 4 shows a simplified circuit diagram of a reference voltage generator FREF3 for generating a function of a reference voltage REF according to aspects of the invention. Here, a current is generated which is a function of the reference voltage to the power of three (cubed reference voltage). It is based on the fact that the collector current through a bipolar transistor is an exponential function of the base-emitter voltage. Solving the equation for the base-emitter voltage $V_{BE}$ results in $$I_C = I_0 \times e^{\frac{V_{BE}}{V_{th}}}, \quad (17)$$

where $V_{th}$ is the thermal voltage $$\left(V_{th} = \frac{kT}{e}\right),$$

which is related to the Boltzmann constant k, the temperature T and the unique charge e. The parameter $I_0$ is dependent on the process, the temperature and the collector-emitter voltage.

Idea is to generate a current $I_{REF}$, which is proportional to the external reference voltage ($I_{REF} \sim REF$) This current is then compared to an internal reference current IB which is related to an internal reference voltage of 2.5 V and referred to as $I_{2.5V}$ (here IB=$I_{2.5V}$):

$$\frac{I_{REF}}{I_{2.5V}} = e^{\left(\frac{V_{BE,REF}}{V_{th}} - \frac{V_{BE,2.5V}}{V_{th}}\right)} \quad (18)$$

The power of three of this ratio will result in $$\left(\frac{I_{REF}}{I_{2.5V}}\right)^3 = \left(e^{\left(\frac{V_{BE,REF}}{V_{th}} - \frac{V_{BE,2.5V}}{V_{th}}\right)}\right)^3 \quad (19)$$

$$= e^3 \times \left(\frac{V_{BE,REF}}{V_{th}} - \frac{V_{BE,2.5V}}{V_{th}}\right)$$

A similar function is realized with the circuitry in FIG. 2. It is analyzed with the following equation:

$$V_{BE,Q1} - V_{BE,Q2} + V_{BE,Q3} - V_{BE,Q4} + V_{BE,Q5} - V_{BE,Q6} = 0 \quad (20a)$$

$$V_{BE,Q6} = V_{BE,Q1} - V_{BE,Q2} + V_{BE,Q3} - V_{BE,Q4} + V_{BE,Q5} \quad (20b)$$

$Q_1$, $Q_3$ and $Q_5$ are supplied with $I_{REF}$, $Q_2$ and $Q_4$ with $I_{2.5V}$. Equation (20b) is therefore equal to:

$$V_{BE,Q6} = 3 \times V_{BE,REF} - 2 \times V_{BE,2.5V} \quad (21)$$

The output current IR3 is therefore $$IR3 = I_0 \times e^{\left(\frac{3 \times V_{BE,REF} - 2 \times V_{BE,2.5V}}{V_{th}}\right)} \quad (22)$$

$$= \frac{I_0^3 \times e^{\frac{3 \times V_{BE,REF}}{V_{th}}}}{I_0^2 \times e^{\frac{2 \times V_{BE,2.5V}}{V_{th}}}}$$

$$= \frac{I_{REF}^3}{I_{2.5V}^2} \sim I_{REF}^3$$

This means that the output current of the reference generator is proportional to the reference current to the power of three. Therefore, the output current is proportional to the reference voltage REF to the power of three. The amplifier OP in FIG. 4 generates the emitter and base voltages based on the collector voltages of Q1 and Q2. An offset error of the amplifier OP will result in a modified collector voltage, which again will have an insignificant influence to I0.

Figure 5:
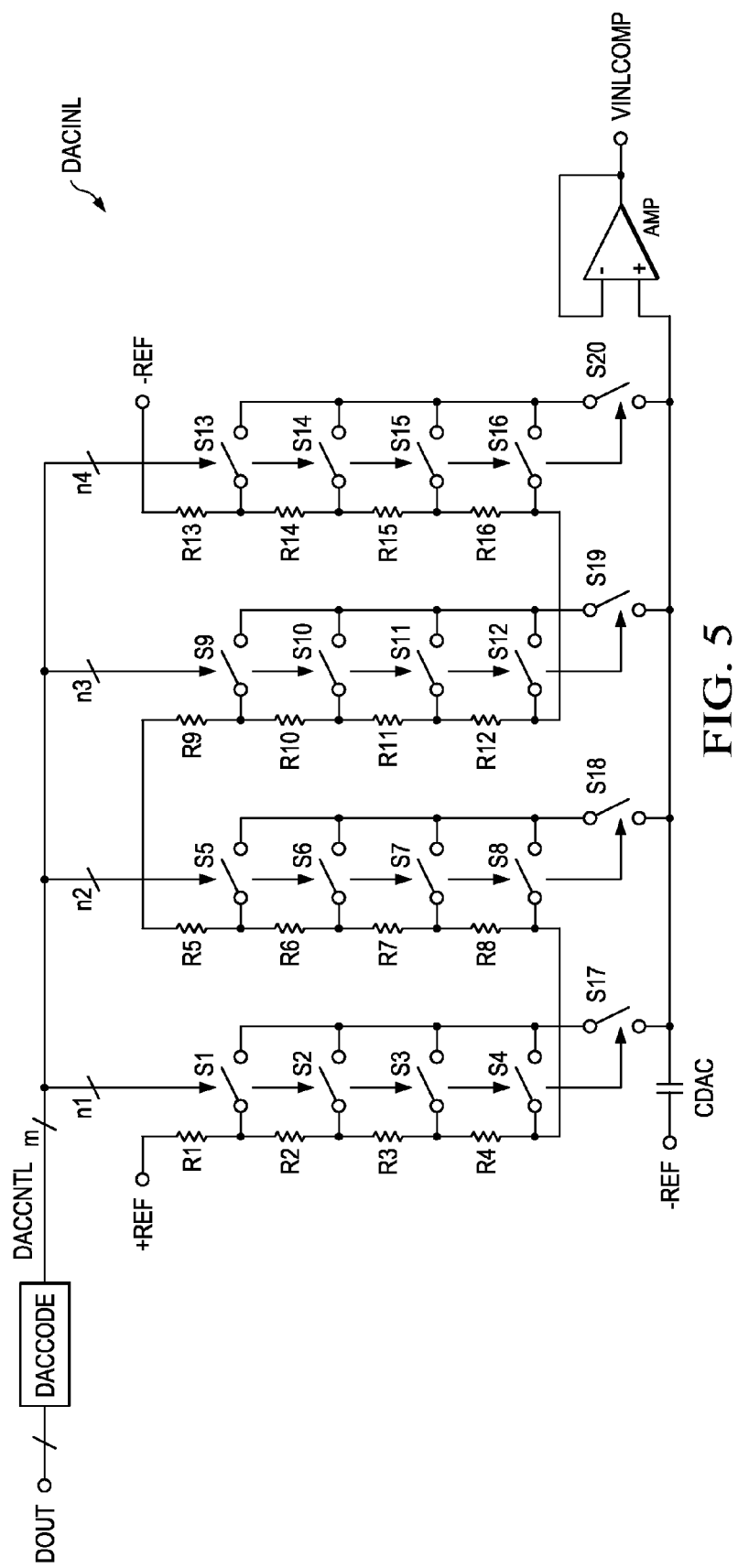
FIG. 5 is a simplified circuit diagram of an INL DAC according to an embodiment of the invention.

FIG. 5 shows a simplified circuit diagram of a resistive string digital-to-analog converter, which can be used as INL digital-to-analog converter DACINL shown in FIG. 1. The INL digital-to-analog converter DACINL may receive the digital output code DOUT from SAR controller SAR-CNTL as shown in FIG. 1. This code may optionally be processed in a processing unit DACCODE (i.e., in order to implement a function) or it may be fed to switches S1 to S20 with minor adaption (i.e., linear throughput). A string of resistors R1 to R16 is coupled to receive reference current IR3 from reference generator FREF3. It is also coupled to GND. In an advantageous embodiment, instead of using GND, an offset voltage may be generated and fed to the pin (the one that is coupled to GND), so that the amplifier AMP is in a suitable operating point. Switches S1 to S20 connect the intermediate nodes between two consecutive resistors of the resistor string R1 to R16 to the positive input node of amplifier AMP (operational amplifier). The operational amplifier AMP is coupled as a voltage follower. At the output of amplifier AMP, the compensation signal $V_{INL,comp}$ is provided. A specific voltage level of output signal $V_{INL,comp}$ is established in response to a digital code DOUT or DACCNTL if a processing unit DAC-CODE is used for implementing a transfer function. The size of resistors R1 to R16 may be varied in order to implement a specific transfer function of input signal DOUT to output signal $V_{INL,comp}$.

In an embodiment of the invention, the resistive digital-to-analog converter DACINL may have a resolution of 10 bit, 128 resistors of equal size may be used in order to realize the function. The first seven bits of the ADC conversion result in the SAR controller may be used for controlling the switches of the string DAC. The output of the amplifier AMP may then be coupled to INL correction capacitors CINLp, CINLn.

Figure 6:
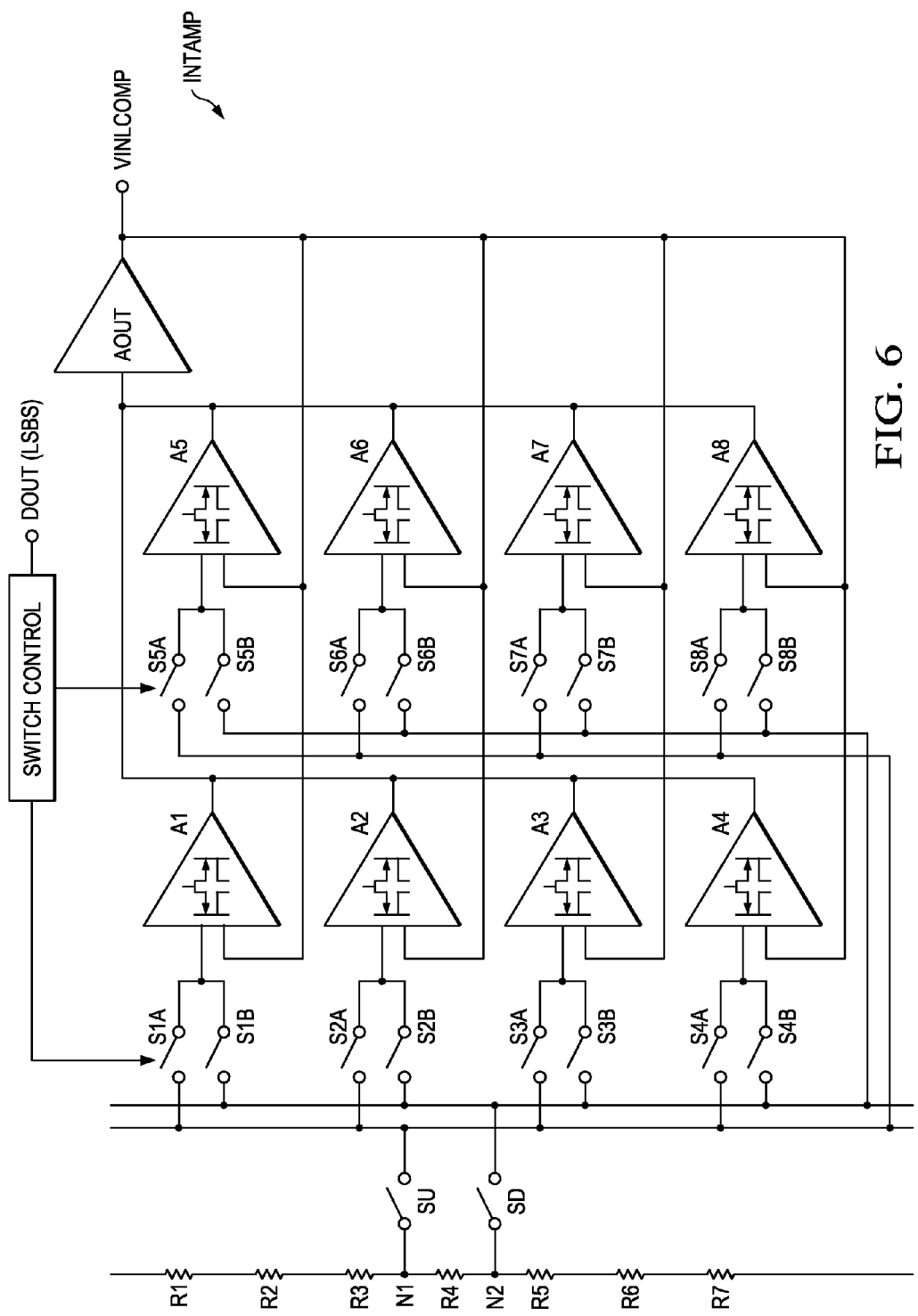
FIG. 6 is a simplified circuit diagram of an interpolating amplifier according to an embodiment of the invention.

FIG. 6 shows a simplified circuit diagram of an interpolating amplifier INTAMP that may be used in the embodiment of FIG. 1. The basic idea consists in interpolating the voltage across each resistor R1 to R7 of the resistive string with differential amplifiers A1 to A8 and output amplifier AOUT. FIG. 6 shows an example for resistor R4. However, each of the other resistors R1, R2, R3, R5, R6, R7 and R8 is assumed to have corresponding switches SD and SU, which are not shown. A first input of amplifiers A1 to A8 may be either coupled to node N1 through switch SU and respective switches S1A to S8A or to node N2 through switch SD and respective switches S1B to S8B. The output of output amplifier AOUT is feed back to the other input of differential amplifiers A1 to A8. The switches S1A to S8A and S1B to S8B can be controlled by the least significant bits of the digital code DOUT (compensation control code from SAR ADC as shown in FIG. 1). The output signal of amplifier AOUT is then the compensation signal $V_{INL,comp}$ shown in FIG. 1. Interpolating the voltage across resistor string R1 to R8 reduces the number of resistors used in the string. A string resistor as shown in FIG. 5 may then be implemented with fewer resistors. An example of an interpolating amplifier is also disclosed in U.S. Pat. No. 6,246,351 B1.

The invention claimed is:

1. An apparatus comprising:
   a capacitive digital-to-analog converter (CDAC) that receives an analog input signal;
   a successive approximation register (SAR) controller that is coupled to the CDAC and that provides a digital code representing a conversion result; and
   an integral non-linearity (INL) compensator is coupled to the SAR controller so as to receive the digital code and that is coupled to the CDAC so as to provides an INL compensation signal to the CDAC to reduce an INL in response to the digital code.

2. The apparatus of claim 1, wherein the INL compensation signal is an analog signal.

3. The apparatus of claim 1, wherein the CDAC further comprises:
   a first set of capacitors that receive in the analog input signal; and
   a compensation capacitor coupled to receive the INL compensation signal.

4. The apparatus of claim 1, wherein the INL compensator further comprises:
   a reference signal generator;
   an INL digital-to-analog converter (DAC) that is coupled to the reference signal generator; and
   an interpolation amplifier that is coupled to the INL DAC and to the CDAC.

5. The apparatus of claim 4, wherein the INL DAC further comprises:
   a processor that is coupled to the SAR controller;
   a switched resistor network that is coupled the reference signal generator and that is controlled by the processor; and
   an operational amplifier that is coupled to the resistor network and the interpolation amplifier.

6. The apparatus of claim 4, wherein the reference signal generator further comprises:
   a first current source;
   a second current source;
   a current mirror that is coupled to the first and second current sources;
   an operational amplifier that is coupled to the first and second current sources;
   a first bipolar transistor that is coupled to the current mirror, wherein the first bipolar transistor is diode-connected;

a second bipolar transistor that is coupled between the first diode-connected transistor and ground, wherein the second bipolar transistor is diode-connected;

a third bipolar transistor that is coupled to the current mirror at its collector and the operational amplifier at its emitter, wherein the third bipolar transistor is diode-connected; and a fourth bipolar transistor that is coupled to the emitter of the third bipolar transistor at its base and that is coupled to the INL DAC circuit at its collector.

7. The apparatus of claim 4, wherein the interpolating amplifier further comprises:

a switch controller that is coupled to the SAR controller;

a switched resistor network that is controlled by the switch controller; and a plurality of differential amplifiers that are each coupled to the switched resistor network; and an operational amplifier that is coupled to each differential amplifier and the CDAC.

* * * * *